United States Patent [19]
Koren et al.

[11] Patent Number: 6,134,250
[45] Date of Patent: Oct. 17, 2000

[54] WAVELENGTH-SELECTABLE FIBER RING LASER

[75] Inventors: Uziel Koren, Fair Haven; Kang-Yih Liou, Holmdel Township, Monmouth County, both of N.J.

[73] Assignee: Lucent Technologies Inc., Murray Hill, N.J.

[21] Appl. No.: 09/078,808

[22] Filed: May 14, 1998

[51] Int. Cl.$^7$ ........................................................ H01S 3/30
[52] U.S. Cl. .................................. 372/6; 372/6; 356/350
[58] Field of Search ................................. 372/6; 356/350

[56] References Cited

PUBLICATIONS

K–Y. Liou, U. Koren, "A 24–channel wavelength–Selectable Er–fiber ring laser with intracavity wavelength–grating–router and semiconductor Fabry–Perot Filter", IEEE Photonic Technology Letter vol. 10, No. 12, Dec. 1998., pp. 1787–1789.

G. Eisentein and R.M. Jopson, "Measurement of the gain spectrum of near traveling wave and Fabry–Perot semiconductor optical amplifier", International Journal Electronics, 1986, vol. 60, No. 1 p. 113–121.

P.E. Bamsley and P.J. Fiddyment, "Wavelength Conversion from 1.3 to 1.5 using split contact optical amplifiers", IEEE Photonic Technology, Letter, vol. 3, No. 3, Mar. 1991., p. 256–58.

T. Keating, "Optical gain and refractive index of a laser amplifier in the presence of pump light for cross–gain and cross–phase modulation" IEEE Photonic Technology Letter, vol. 9, No. 10, Oct. 1997.

T. Miyazaki, N. Edagawa, S. Yamamodo, and S. Akiba, "A multiwavelength fiber ring–laser employing a pair of silica–based arrayed–waveguide–gratings," IEEE Photon. Technol. Lett., vol. 9, pp. 910–912, 1997.

*Primary Examiner*—Frank G. Font
*Assistant Examiner*—Delma R. Flores Ruiz
*Attorney, Agent, or Firm*—John A. Caccuro

[57] ABSTRACT

A stable single-mode wavelength selectable ring laser operates at a single wavelength which is selectable from any channel passband of a multiple-channel wavelength multiplex/demultiplexer element (e.g., an arrayed waveguide grating router (AWGR)). A Fabry-Perot semiconductor optical amplifier (FP-SOA) is connected together with the AWGR to form a ring laser structure where the FP-SOA is used as an intra-cavity narrow-band mode-selecting filter to stabilize ring laser oscillation to a single axial mode. This is the first time that a FP-SOA is used in a fiber ring laser as a mode-selecting interferometer with gain.

31 Claims, 8 Drawing Sheets

SINGLE-MODE LASER

MULTI-MODE LASER

WAVELENGTH-SELECTABLE FIBER RING LASER

TECHNICAL FIELD OF THE INVENTION

This invention relates to ring lasers and, more particularly, to wavelength-selectable fiber ring lasers.

BACKGROUND OF THE INVENTION

Wavelength selectable lasers are becoming important components for optical networks employing dense wavelength division multiplexing (DWDM). As the number of WDM channels increases, very tight control of emission wavelengths of lasers used in the transmitters is necessary. Transmitters having their output wavelengths selectable between specified channel wavelengths can be very useful at reconfigurable wavelength add/drop nodes. Wavelength selectable lasers can also be employed as standby transmitter sources for reliability assurance to prevent events of system failures due to transmitter failures in a DWDM system. Several wavelength-selectable lasers have been proposed for DWDM systems, including tunable semiconductor distributed-Bragg-reflector lasers, WDM laser arrays with an integrated output coupler [1], and the integrated waveguide grating multifrequency laser [2,3]. (Note that in the above and following description, a reference's identification [e.g., 2] refers to that reference's location in the Appendix) The integrated multifrequency laser utilizes an InP-based waveguide grating router (WGR) for mode selection. The passive semiconductor WGR can accurately set the channel spacing of the multifrequency laser output. Recently, fiber ring lasers using Er-doped fiber amplifiers (EDFA) as the gain medium and a silica-based WGR for wavelength selections also have been reported [4,5]. The fiber lasers can be constructed using commercially available EDFAs and silica WGRs and the lasing wavelengths are self-aligned to the bandpass wavelengths of the WGRs. However, previously reported grating-router Er-fiber ring lasers do not operate in a single mode. Because of the long fiber cavity length, there are typically 1,000 to 10,000 axial modes within the 3-dB passband of a WGR. The WGR Er-fiber ring lasers oscillate with closely-spaced (less than 10 MHz) multiple axial modes that are not resolved by an optical spectrum analyzer [5]. Such multi-mode fiber ring lasers can not be used for communications because the inter-modal optical beat noises are within the bandwidth of the receiver. What is needed is a stable single-mode wavelength selectable ring laser for use in DWDM communication systems.

SUMMARY OF THE INVENTION

In accordance with the present invention, a stable single-mode wavelength selectable ring laser is disclosed that operates at a single wavelength, which is selectable from any channel passband of a multiple-channel wavelength multiplexer/demultiplexer element (e.g., an arrayed waveguide grating router (AWGR)). A Fabry-Perot semiconductor optical amplifier (FP-SOA) is connected together with the AWGR to form a ring laser structure where the FP-SOA is used as an intra-cavity narrow-band mode-selecting filter to stabilize ring laser oscillation to a single axial mode. This is the first time that a FP-SOA is used in a fiber ring laser as a mode-selecting interferometer with gain. In another embodiment Erbium fiber is also used as a gain element of the ring laser. The long cavity mode build-up time of the Er-fiber ring laser and multiple passes through the FP-SOA in the ring cavity can effectively stabilize the laser output in a single axial mode. In one embodiment, the (AWGR) is a multiple-channel silica AWGR and the lasing wavelength is self-aligned to any selected channel wavelength of the AWGR.

According to another aspect of the invention, a wavelength-selectable ring laser includes a demultiplexer AWGR having its outputs connected through a plurality of electrically switchable optical amplifiers (e.g., FP-SOAs) to a demultiplexer AWGR and back to the input of the demultiplexer AWGR. A wavelength is selected by switching-on a switchable optical amplifier associated with the desired wavelength.

According to other aspect of the invention, a wavelength division multiplexing (WDM) optical communication system includes an add/drop circuit including the wavelength-selectable ring laser which may be implemented as part of the wavelength multiplexer or demultiplexer elements of the add/drop circuit.

DETAILED DESCRIPTION

In the following description, each item or block of each figure has a reference designation associated therewith, the first number of which refers to the figure in which that item is first located (e.g., 101 is located in FIG. 1).

Figure 1:
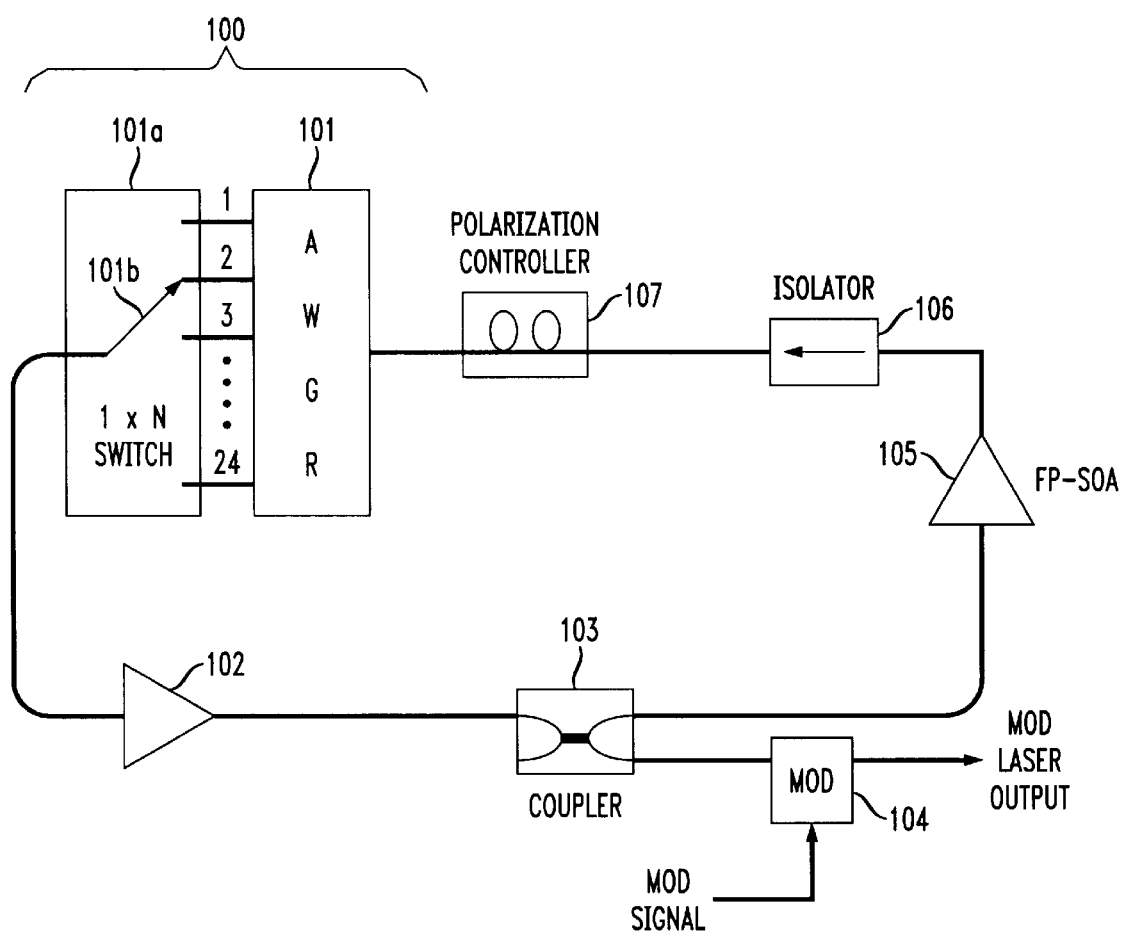
FIG. 1 shows an illustrative configuration of a wavelength-selectable fiber ring laser in accordance with the present invention.

Shown in FIG. 1 is a configuration of a wavelength-selectable fiber ring laser in accordance with the present invention. A wavelength selection unit 100 is arranged for receiving an optical signal and outputting a selected one of a plurality of wavelength bands. The wavelength selection unit 100 can generally be a wavelength multiplexer/demultiplexer element 101 connected 101b so as to pass the desired wavelength band. In our example the wavelength multiplexer/demultiplexer element 101 is a 24-channel arrayed waveguide grating router (AWGR) and the connection 101b is provided by a 1×N optical fiber switch unit 101a. The switch unit can be mechanically or electrically operated to select the desired wavelength pass band. The AWGR 101, illustratively, has Gaussian passbands with 0.8-nm (100-GHz) 3-dB bandwidth. It should be noted that while as shown in FIG. 1, the wavelength selection unit 100 (AWGR 101/switch unit 101a) is connected to use AWGR 101 as a demultiplexer, the wavelength selection unit 100 will also operate effectively when flipped left-to-right so that AWGR 101 is used as a multiplexer. One illustrative type of AWGR that may be utilized is the waveguide grating router (WGR) type described in U.S. Pat. No. 5,136,671, issued to C. Dragone on Aug. 4, 1992 which is incorporated by reference herein. In the illustrative AWGR 101 utilized herein, the wavelength channel spacing is 1.6 nm (200 GHz) and the free spectral range is 38.4 mn. The 1×N switch unit 101a, which illustratively may be a 1×N mechanical/optical switch, is used to select a wavelength channel of AWGR 101.

The Fabry-Perot semiconductor optical amplifier (FP-SOA), 105, is a semiconductor amplifier which may provide sufficient optical signal gain to ensure ring laser operation. The system may optionally include an optical amplifier 102 to provide additional optical signal gain, if needed to ensure laser operation. In the FIG. 1 embodiment, the optical amplifier 102 may be a well known semiconductor optical amplifier (SOA) or an Erbium-doped fiber amplifier (EDFA). FIG. 1 assumes the existence of a EDFA 102 as the optical amplifier 102, the length of EDFA, 102 is, illustratively, 23 meters(m) and is pumped by a 980-nm semiconductor laser (not shown). In the ring laser of FIG. 1, the FP-SOA 105 is, illustratively, arranged to operate below threshold with non-lasing resonances due to residual reflections from partially anti-reflection coated facets. The free spectral range of the FP-SOA 105 is 20.7 GHz. The FP-SOA 105 is used as an intra-cavity narrow-band mode-selecting filter to amplify a sub-band of the selected channel wavelength band so as to stabilize ring laser oscillation to a single axial mode. The present invention is the first time that a FP-SOA 105 was used in a fiber ring laser as a mode-selecting interferometer with gain.

An optional optical isolator 106 may be used in the ring cavity to assure uni-directional ring laser oscillation. Without the use of optical isolator 106, additional lasing modes, which may be undesirable to a particular application, may result. It should be noted that the EDFA 102 used in the arrangement of FIG. 1 also has built-in optical isolators.

An optical coupler 103 is used to output the laser signal from the ring laser of FIG. 1. Illustratively, a 90/10 fiber coupler 103 is used for the laser output. An optical modulator 104 is used to modulate the laser signal with the modulated (MOD) signal to produce a MOD laser output signal. Illustratively, a semiconductor electro-absorption modulator is used as modulator 104. Other types of modulators, such as a lithium niobate waveguide modulator, for example, can be used as modulator 104.

An optional polarization controller 107 may be used if the FP-SOA 105 or AWGR 101 is polarization dependent or single-polarization oscillation of the ring laser is desired. In our illustrative example, the optical gain of the FPSOA 105, having equal numbers of compressively-strained and tensile-strained quantum wells in the active region, is polarization insensitive, so that the ring laser threshold and the output power are not sensitive to fiber bending. However since in our illustrative ring laser of FIG. 1, AWGR 101 is implemented using a AWGR 101 which is slightly polarization dependent, the optional polarization controller 107 is used in the cavity. The TE and TM passband peaks of the AWGR 101 are offset by about 5 GHz, which is tolerable for WDM mux/demux operation, but is excessive for the ring laser of FIG. 1, and polarization controller 107 is necessary for stable single-mode oscillation. The FP-SOA 105 also has different TE and TM effective indices that would require polarization control. While in certain ring laser embodiments more than one polarization controller 107 may be needed, in our illustrative ring laser shown in FIG. 1 one polarization controller was found to be sufficient for single-mode stabilization.

Figure 2:
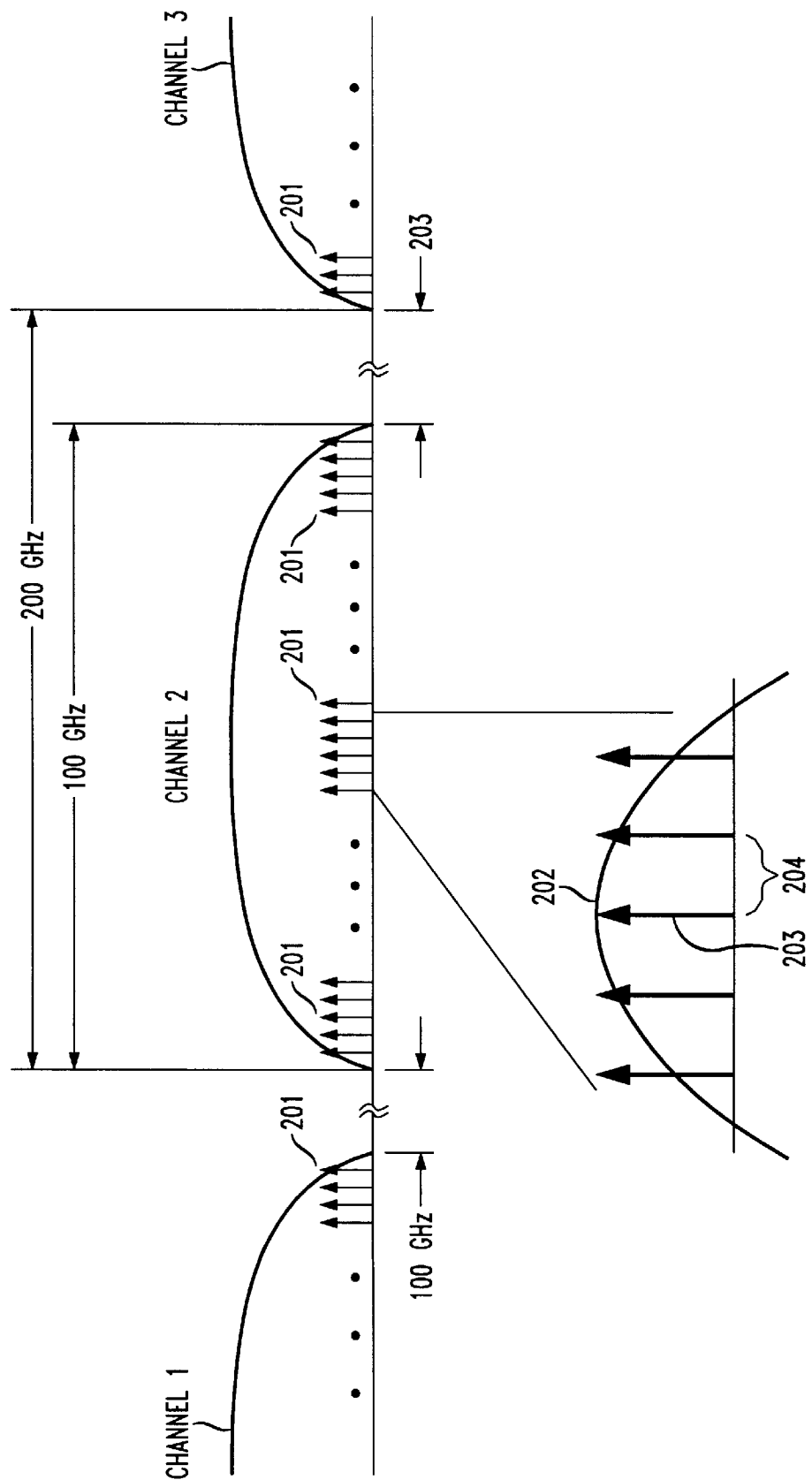
FIG. 2 shows the principle of wavelength selection.

In our illustrative ring laser of FIG. 1, the total length of the ring cavity including all fiber components is 60 m. The unsaturated EDFA, 102, gain is about 22 dB and the fiber-to-fiber gain of the FP-SOA, 105, is 17 dB. The round-trip cold cavity loss, including 7-dB AWGR insertion loss and losses of all other components and connectors, is about 12 dB. By connecting the fiber to one of the output ports (channels) of the AWGR 101 (channel 2, as shown in FIG. 1) to form the ring cavity, lasing wavelength can be selected between the 24 channel wavelengths. The connection to channel 2 can be made manually, mechanically using a 1×N optical switch, or electronically, as will be discussed in FIG. 7. reference to FIG. 2 there is shown, illustratively, the channels 1–3 of the multiple-channel arrayed AWGR 101 of FIG. 1. As shown each channel has a channel separation of 200 GHz (1.6 nm) and a 3-dB Gassian passband of 100 GHz (0.8 nm) (e.g., see channel 2 in FIG. 2). As previously noted, since Erbium fiber ring lasers are not single-mode there may be $10^3$ to $10^4$ axial modes 201 generated within the passband of each channel. As will be discussed later the axial mode spacing 204 for our illustrative FIG. 1 ring laser of 60-m length was 3.4 MHz. These multiple axial modes, undesirably, cause inter-modal optical beat noise that are within the bandwidth of system receivers. The bandwidth of a Fabry-Perot semiconductor optical amplifier (FP-SOA) 105 used as a modeselecting filter is shown by 202. The FP-SOA filter 105 characteristic 202 repeats with spacing $\Delta f = C/2nL$, where C is the speed of light in meters per second, n is the group index of the amplifier waveguide and L is the length of the Fabrey-Perot cavity. The bandwidth and spacing of the filter passbands of FP-SOA 105 is selected so that only one passband falls near the transmission peak of the selected AWGR frequency channel (i.e., 202 of channel 2) of the FIG. 1 ring laser. Also, only a small number of ring cavity modes 201 falls within the passband 202 of FP-SOA 105, such that the mode 203 closest to the peak of the passband is selected for laser oscillation. As shown, the characteristics of FP-SOA filter 105 in the ring laser of FIG. 1 is selected so as to result in only single-mode lasing, 203, at approximately the center frequency of channel 2. The center frequency is desired since that is the frequency where the channel 2 of AWGR 101 has the least loss and hence the frequency where the ring laser of FIG. 1 has greatest loop gain. Since the AWGR channel bandwidth is, illustratively, about 5 times the free spectral range of the FP-SOA, the FP-SOA passband 202 near the center frequency of channel 2 is always automatically selected by the ring laser for oscillation. This results in a stable single-mode ring laser operation. If a frequency other than the center frequency is desired, the characteristics of FP-SOA filter 105 can be selected to select that frequency. Frequency selection can be done, for example, by temperature tuning of the AWGR and/or by electrical current tuning of the FP-SOA.

Figure 3:
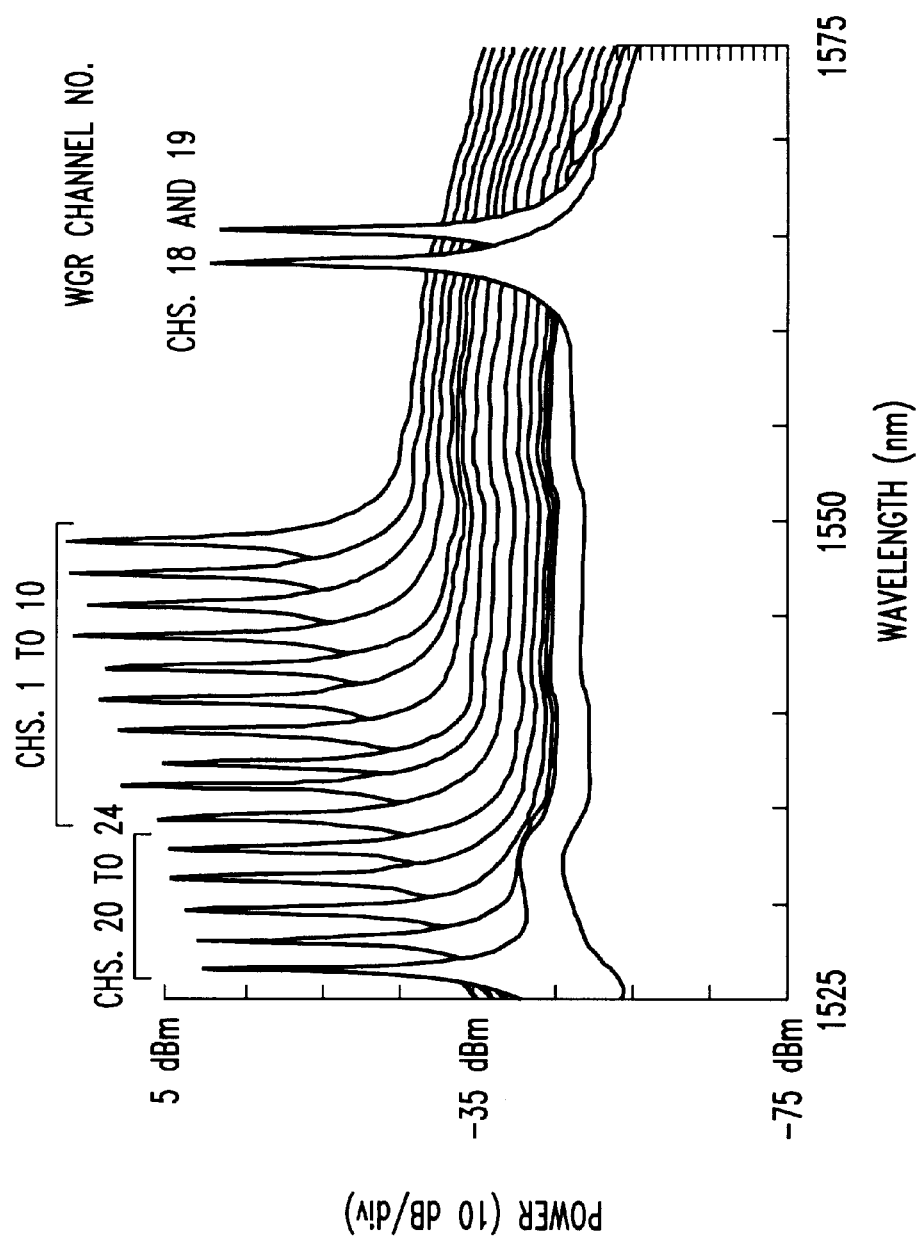
FIG. 3 shows illustrative output spectra of the ring laser at different channel wavelengths of a 24-channel WGR.
Figure 4A:
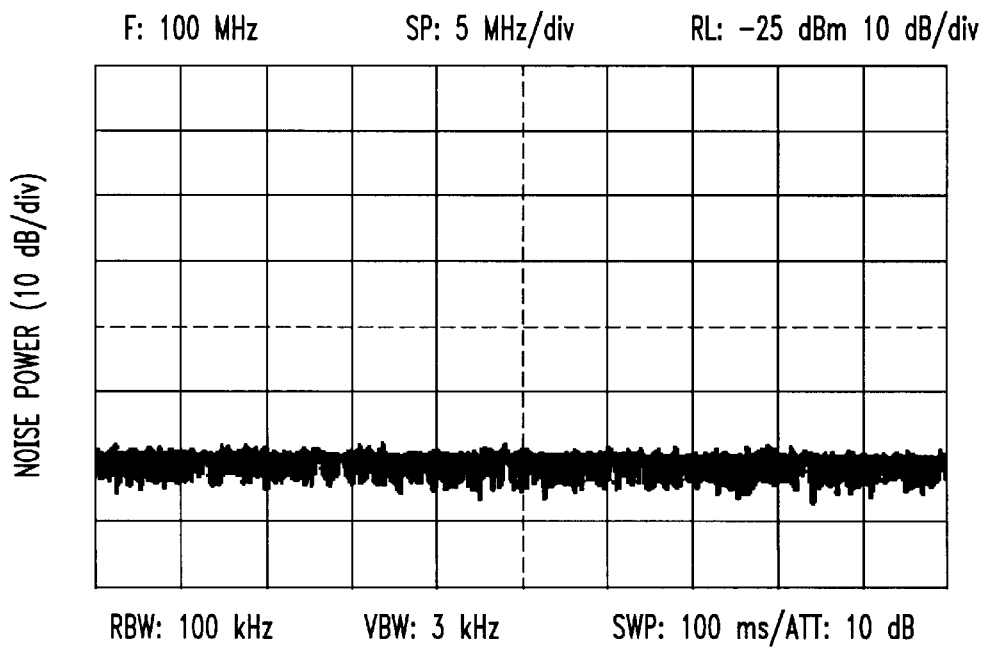
FIG. 4 shows illustrative RF noise spectra near 100 MHz center frequency for (a) single-mode ring laser output, and (b) when laser output contains multiple axial modes.
Figure 4B:
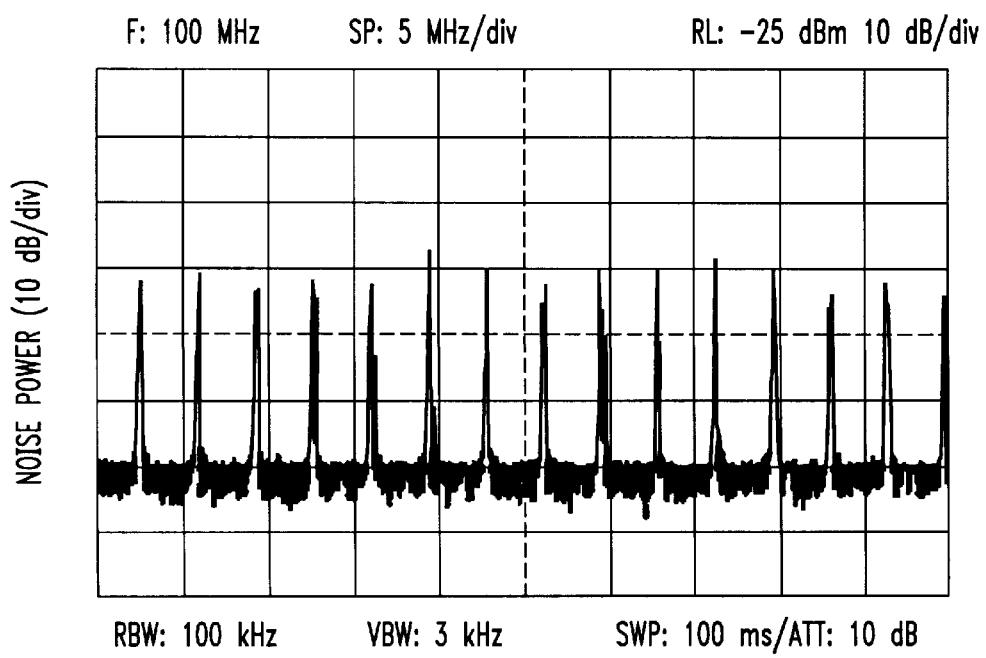
Figure 5:
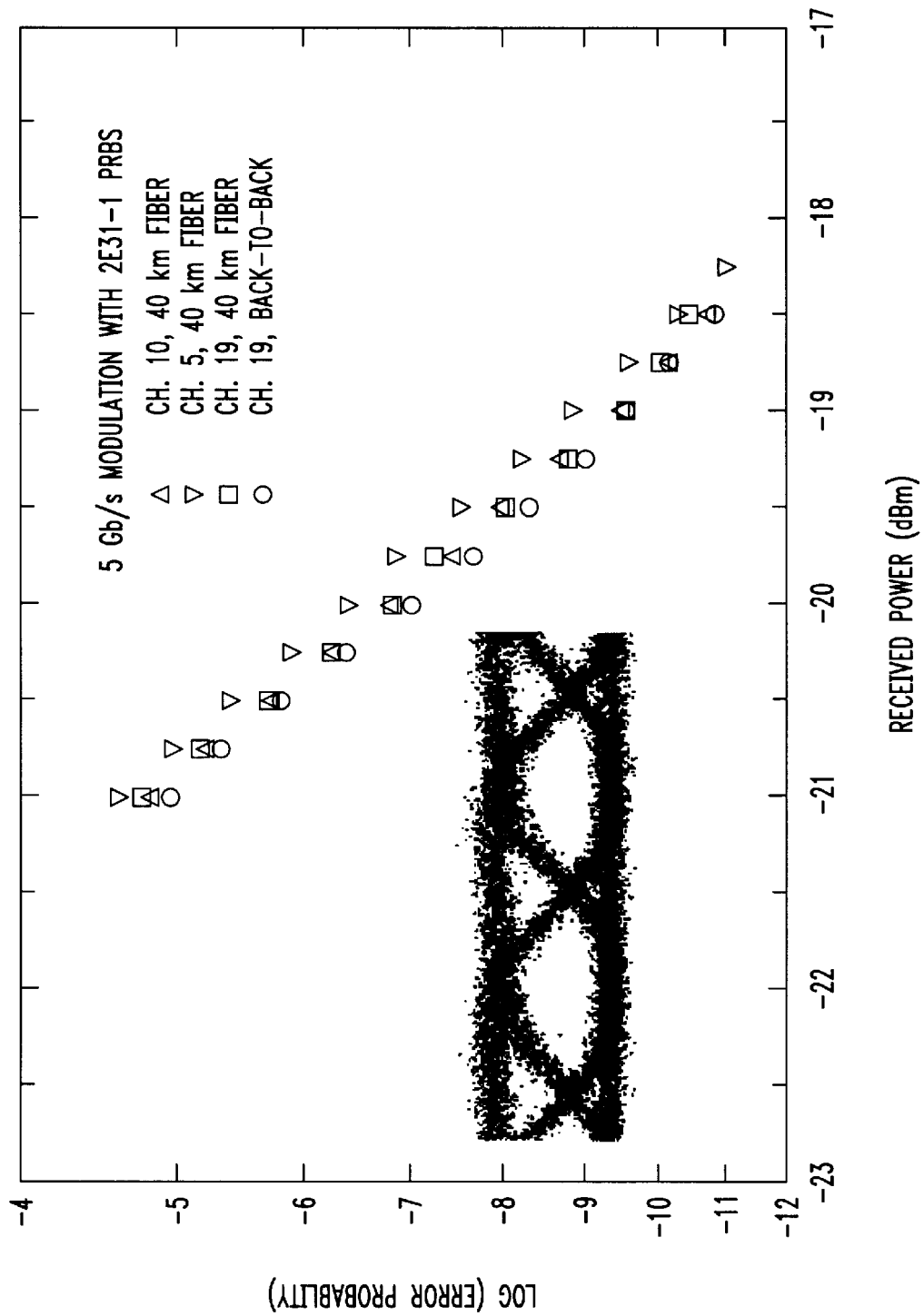
FIG. 5 shows illustrative measured bit-error-rate curves at 5 Gb/s for the ring laser modulated with an external electro-absorption modulator. The inset shows an open eye-pattern.

The laser output spectra, for the illustrative ring laser of FIG. 1, was measured using an optical spectrum analyzer with 0.1-nm resolution, and are shown in FIG. 3. All 24 wavelengths can be selected, and the laser output power is about 0 dBm. The laser oscillates near the center wavelength of one WGR passband where the round trip gain is highest. All channels oscillate with single wavelength, except channel 20, which can oscillate with one or two wavelengths-one on each side of the WGR free spectral range. In the case of channel 20, a coarse bandpass filter can be inserted to suppress the free-spectral-range repeat for single wavelength oscillation. The laser output was detected using an O/E converter (dc to 15 GHz bandwidth) and the RF noise spectra are shown in FIG. 4. The polarization controller was adjusted for single-mode output, shown in FIG. 4a, and multi-mode output in FIG. 4b. The axial mode spacing corresponding to the 60-m ring cavity length is 3.4 MHz. The noise spectrum in FIG. 4b near 100 MHz center frequency clearly shows optical beating between axial modes. The range of the beat noise can extend from dc to a few GHz, and the modulated laser output shows closed eyes. Without using the FP-SOA filter 105, the laser could not oscillate with stable single mode and multi-mode noise spectra similar to FIG. 4b were observed. The use of the FP-SOA filter 105 and the polarization controller 107 stabilized the ring laser output in a single axial mode. The ring laser output was then modulated with $2^{31}-1$ words at 5 Gb/s using a semiconductor electroabsorption modulator $10^4$. Measured bit error rate curves for a few typical wavelength channels are shown in FIG. 5. The inset shows an open eye pattern received after 40 km of fiber.

The ring laser cavity build-up time is about 23 μs, which was measured by using an electro-absorption modulator in the cavity for on/off switching. A slow mode build-up time of about 10 μs in an Erbium fiber laser, measured for switching between two modes of comparable thresholds, has also been reported [6]. The measured mode build-up time in our laser equals 78 round trips in the cavity. The functionality of the FP-SOA 105 as an effective narrowband filter due to multiple passes can be modeled as follows. The net optical gain for one round-trip in the ring cavity is $$G=(1-\eta)G_{FP}T_{WG}G_{EDF}\exp(-\alpha L) \qquad (1)$$

where η (is the laser output coupling, $G_{EDF}$ is the EDFA gain, α is the distributed loss of all loss mechanisms, including the insertion losses of WGR 111, isolator, polarization controller 107, fiber connectors, and fiber to FP-SOA 105 chip coupling losses. The intensity gain of a FP-SOA 105 can be shown to be [7]

$$G_{FP} = \frac{(1-R_1)(1-R_2)g}{1-2\sqrt{R_1R_2}\, g\cos[2\pi(f-f_0)/\Delta f]+R_1R_2g^2} \qquad (2)$$

where $R_1$ and $R_2$ are the facet reflectivities, g is one way gain of the FP-SOA, (f-f0) is the deviation from resonance frequency. We note that $G_{FP}$ has multiple resonances separated by the free spectral range Δf. The Gaussian transmission function of the WGR is $$T_{WG}=\exp[-\kappa(f-f_n)^2] \qquad (3)$$

where $f_n$ is the center frequency of the passband of the n-th channel. Using Eq. 1 with the approximation that $(f-f_0)<<\Delta f$ due to multi-pass bandwidth narrowing, the regenerative gain after N round-trips, normalized by the gain at a resonance frequency $f_0$, is $$G(N)=[1+4(f-f_0)^2/B^2]^{-N}\exp[-N\kappa(f-f_n)^2] \qquad (4)$$

where B is the single-pass 3-dB bandwidth (FWHM) of the FP-SOA filter. The 3-dB Gaussian passband of the WGR 111 is reduced by a factor of $(1/N)^{1/2}$, but is still too wide for single mode oscillation. Spectral narrowing is due mainly to the FP-SOA 105. From Eq. 4 we obtain the effective filter bandwidth after N round-trips:

$$B(N)=B\{\exp[1n(2)/N]-1\}^{1/2} \qquad (5)$$

The filter functionality of a FP-SOA 105 is determined by its finesse, which is given by Eq. 2 as $$F=\Delta f/B=(\pi/2)/\sin^{-1}\{[(1-R_1)(1-R_2)]^{1/2}/2[G_{FP}(f_0)]^{1/2}(R_1R_2)^{1/4}\} \qquad (6)$$

In one illustrative system, we measured Δf=20.7 GHz (2-mm FP-SOA 105 chip length), chip gain $G_{FP}$=26 dB (17 dB fiber-to-fiber gain). For ($R_1=R_2=0.05$), finesse F=14.7 from Eq. 6, and B=1.4 GHz. For a cavity build-up time corresponding to N=80 in the experiment, the effective bandwidth B(N) from Eq. 5 is reduced to 130 MHz. This multi-pass effective filter bandwidth contains only 38 axial modes of the ring cavity (compared to 3200 modes within the WGR bandwidth if the FP-SOA 105 was not used), resulting in sufficient mode selectivity in the experiment for single mode laser output. The cavity length (60 m in the illustrative system) can be reduced by a factor of two to further reduce the number of axial modes in the effective 3-dB filter bandwidth. The use of the FP-SOA 105 as a filter has another advantage that its transmission peak frequency can be tuned by the injected carrier population to match the Gaussian passband of the WGR 111. Fine tuning, however, is not necessary. Since the carrier density in the FP-SOA 105 is clamped at threshold of the ring-cavity lasing mode, the FP-SOA 105 may have a self-tuning effect that automatically fine tunes the filter frequency to the lasing frequency.

Figure 6:
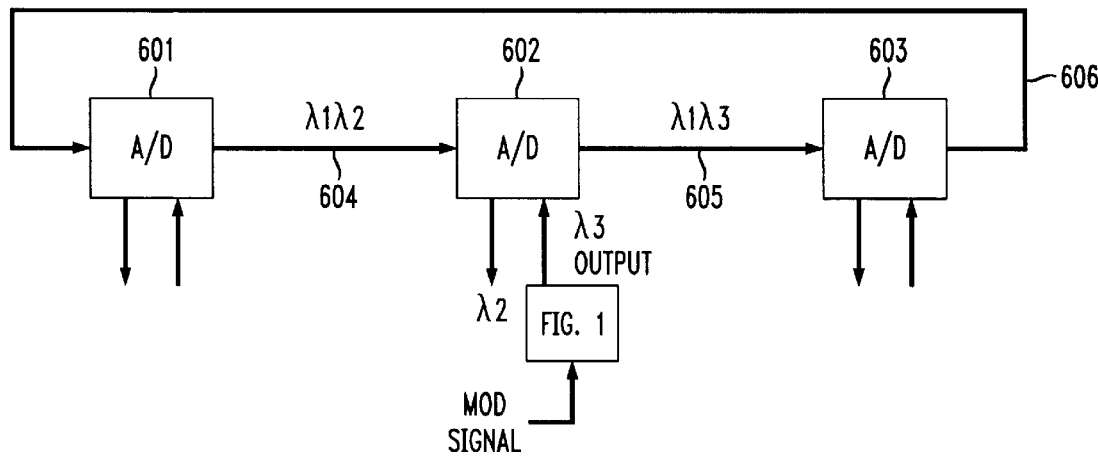
FIG. 6 shows an illustrative wavelength division multiplex (WDM) communication system including an add/drop circuit incorporating the present invention.

FIG. 6 shows an illustrative wavelength division multiplex (WDM) communication system including an add/drop circuit 602 incorporating the present invention. As shown the WDM system includes add/drop circuits 601–603 connected over facilities 604–606. The wavelengths λ1 and λ2 are shown to enter add/drop circuit 602 via facility 604. The add/drop circuit 602 may be implemented using any of a variety of well known circuits or may be implemented using our add/drop circuit shown in FIG. 8. At add/drop circuit 602, the wavelength λ2 is dropped and the wavelength λ3 is added. The modulated wavelength λ3 is generated using our ring laser circuit of FIG. 1 which is modulated by the signal MOD signal.

Figure 7:
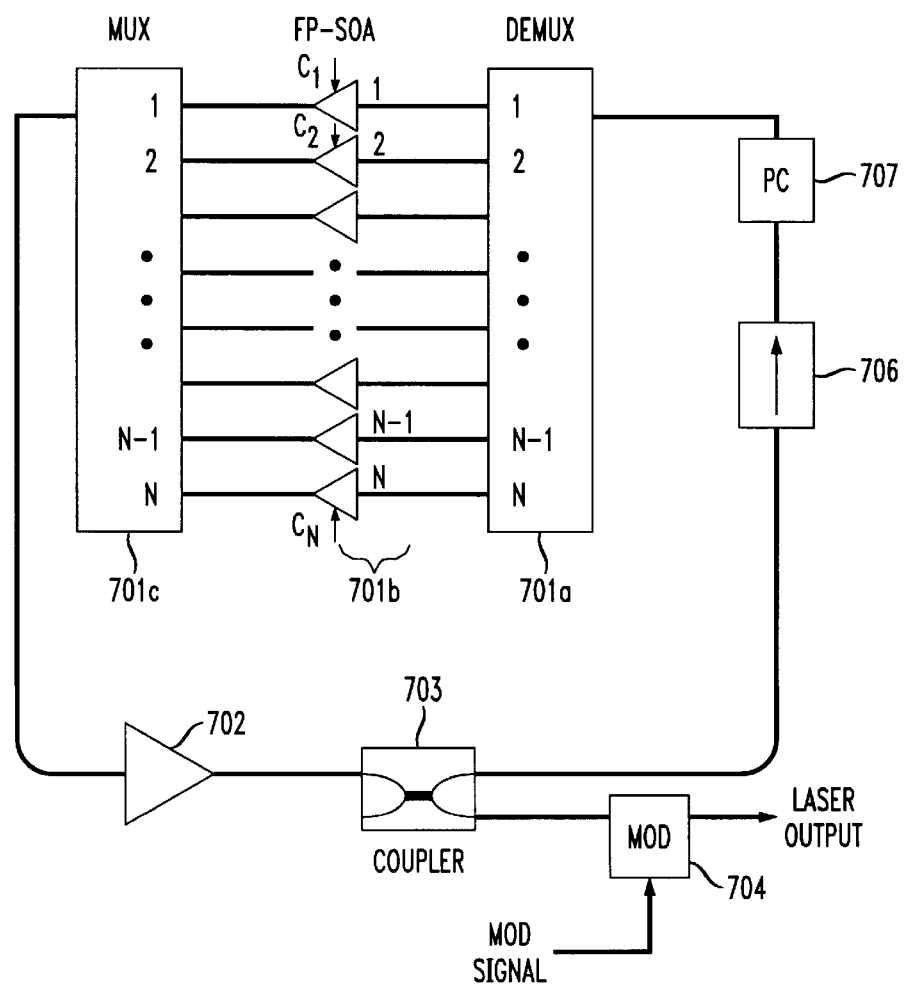
FIG. 7 shows an illustrative wavelength-selectable ring laser including a demultiplexer WGR having its outputs connected through a plurality of electrically switchable optical amplifiers to a multiplexer WGR and through an optional optical amplifier to the input of the demultiplexer WGR.

FIG. 7 shows an illustrative wavelength-selectable ring laser including a WDM demultiplexer 701a (e.g., AWGR ) having its outputs connected through a plurality of switchable optical amplifiers 701b to a multiplexer 701c and through coupler 703 to the input of the demultiplexer 701a. In a preferred embodiment, the switchable optical amplifiers 701a is a FP-SOA array which is less expensive than EDFAs and which utilizes electrical switching. However, it should be noted that an EDFA array could also be used as the switchable optical amplifiers 701a, since an EDFA can also be electrically switched by switching its pump laser. The modulator 704 modulates the laser signal using the MOD signal. In FIG. 7 and as previously discussed with reference to FIG. 1, optional polarization controller 707, isolator 706, and optical amplifier 702 can also be added to the ring laser. The elements 702–707 operate in the same manner as the elements 102–107 of FIG. 1. The demultiplexer AWGR 701a, switchable optical amplifiers (e.g., FP-SOAs) 701b, and multiplexer WGR 701c together provide an electrically switchable method of selecting the wavelength of the ring laser. The wavelength is selected when one of the control signals C1–CN "turn-on" its associated one of the optical amplifiers 701*b*. Thus, for example, if a wavelength within the channel 2 passband is desired, then control signal C2 is used to enable optical amplifier 2, while the other optical amplifiers 1, 3–N are disabled by control signals C1, C3–CN. The laser cavity then includes the channel 2 path through demultiplexer 701*a*, optical amplifier 701*b*, and multiplexer 701*c*, and extends through elements 702–707.

Figure 8:
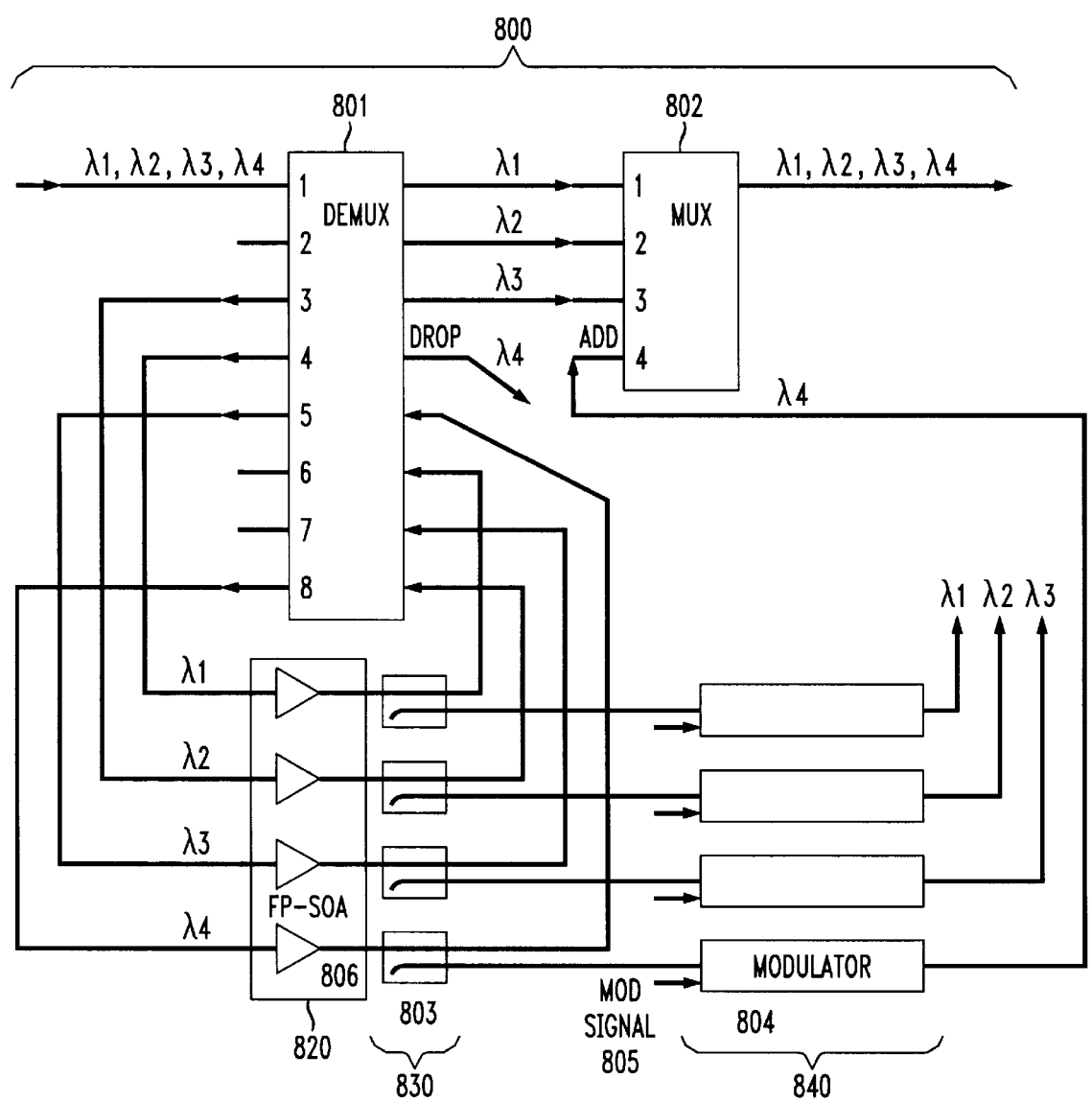
FIG. 8 shows an illustrative add/drop circuit where the demultiplexer of the add/drop circuit is shared with a wavelength-selectable ring laser.

FIG. 8 shows, in accordance with one aspect of the present invention, an illustrative add/drop circuit 800 where the demultiplexer 801, which is the drop portion of the add/drop circuit 800, is shared with a wavelength-selectable ring laser. The demultiplexer 801 forms a wavelength drop circuit for the wavelength $\lambda 4$ and passes wavelengths $\lambda 1$ and $\lambda 3$ to multiplexer 802. The multiplexer 802 receives, at input port 4, the wavelength $\lambda 4$ together with wavelengths $\lambda 1$–$\lambda 3$, at input ports 1–3, which are multiplexed to form the multiplexed signal $\lambda 1$–$\lambda 4$ at output port 1. The wavelength $\lambda 4$ is generated by a wavelength-selectable ring laser formed by the demultiplexer 801 and FP-SOA 806. The coupler 803 couples the wavelength $\lambda 4$ to modulator 804 where it is modulated using MOD signal 805. The modulated wavelength $\lambda 4$ output from modulator 804 is added at input port 4 of multiplexer 802 of add/drop circuit 800. The other wavelengths $\lambda 1$–$\lambda 3$ are also formed in the arrangement of FIG. 8 by using selected input and output ports of demultiplexer 801 and a FP-SOA of Amplifier array 820. These wavelengths $\lambda 1$–$\lambda 3$ can then be coupled using a coupler (from group 830) to a modulator (from group 840) to form modulated wavelengths $\lambda 1$–$\lambda 3$. If demultiplexer 801 is an AWGR, the input and output ports of demultiplexer 801 used to generate a particular wavelength is selected using the routing formula $N\lambda =(Nin+Nout-1)$ modulus N, where $N\lambda$ is the desired wavelength (i.e., $\lambda 1$–$\lambda 4$) to be produced and $N\lambda =N$ when $N\lambda =0$, where Nin is the input port and Nout is the output port of demultiplexer 801 which is needed to produce the desired wavelength $N\lambda$, and where modulus N is the number of input and output ports (8 in our example) of demultiplexer 801. This routing formula is used for identifying the ports to be connected as part of the ring cavity for laser oscillation at wavelength number $N\lambda$, and is also used for selecting the input port of multiplexer 802 to enable the multiplexing of the added wavelength(s) to the output port of multiplexer 802. Illustratively in FIG. 8, the wavelength $\lambda 4$ is formed using the input port 8 and the output port 5 of demultiplexer 801.

Inserting input port 8 and output port 5 into the above-referenced routing formula $N\lambda =(Nin+Nout-1)$ produces $N\lambda =(8+5-1)=12$. Since the modulus is 8 for demultiplexer 801 (i.e., it has 8 inputs and outputs) the number 12 is counter down by the modulus 8 and results in a remainder of 4, indicating that the wavelength $\lambda 4$ will be formed in the ring laser. The ring laser for wavelength $\lambda 4$ is formed by the loop extending through input port 8 of demultiplexer 801, FP-SOA 806, coupler 803, output port 5 of demultiplexer 801 and back to input port 8 of demultiplexer 801. It should be noted that it is possible to use other combinations of Nin and Nout to generate $\lambda 4$. In a similar manner as described above, the wavelengths $\lambda 1$–$\lambda 3$ are formed using input and output ports of demultiplexer 801 selected using the routing formula $N\lambda =(Nin+Nout-1)$ modulus N. It should be noted that the number of wavelengths produced is determined by the size (i.e., the number of input and output ports) of the AWGR used as demultiplexer 801. Additionally, it should be noted that since the AWGR used as demultiplexer 801 is bidirectional, the FP-SOA array 820 and coupler group 830 can be flipped left-to-right so that the generated wavelengths $\lambda 1$–$\lambda 4$ flow in a clockwise direction in their respective loops (rather than counterclockwise as shown in FIG. 8).

Figure 9:
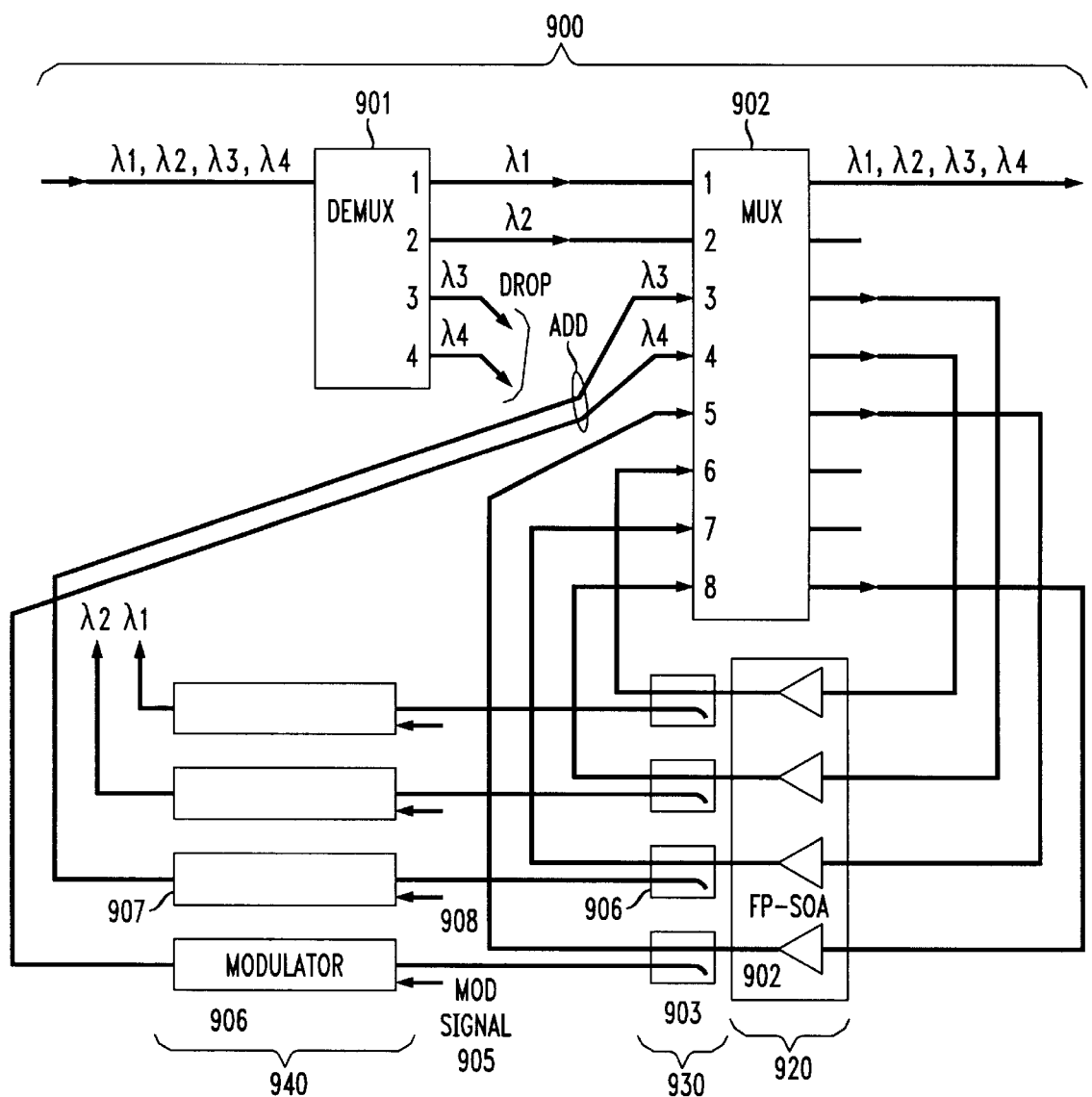
FIG. 9 shows an illustrative add/drop circuit where the multiplexer of the add/drop circuit is shared with a wavelength-selectable ring laser.

FIG. 9 shows, in accordance with yet another aspect of the present invention, an illustrative add/drop circuit 900 where the multiplexer 902, which is the add portion of the add/drop circuit 900, is shared with a wavelength-selectable ring laser. As shown, demultiplexer 901 forms a wavelength drop circuit for the wavelengths $\lambda 3$ and $\lambda 4$ and passes wavelengths $\lambda 1$ and $\lambda 2$ to multiplexer 902. The multiplexer 902 receives the added wavelengths $\lambda 3$ and, at input ports 3 and 4, respectively, which together with wavelengths $\lambda 1$–$\lambda 2$, at input ports 1–2, respectively, are multiplexed to form the multiplexed signal $\lambda 1$–$\lambda 4$ at output port 1. The wavelengths $\lambda 3$ and $\lambda 4$ are generated by wavelength-selectable ring lasers formed by multiplexer 902 and FP-SOA 906. The coupler 903 couples the wavelength $\lambda 4$ to modulator 904 where it is modulated using MOD signal 905. The modulated wavelength $\lambda 4$ output from modulator 904 is connected as an add signal to input port 4 of multiplexer 902 of add/drop circuit 900. Similarly, the coupler 906 couples the wavelength $\lambda 3$ to modulator 907 where it is modulated using MOD signal 908. The modulated wavelength $\lambda 3$ output from modulator 907 is connected as an add signal to input port 3 of multiplexer 902 of add/drop circuit 900. The other wavelengths $\lambda 1$ and $\lambda 2$ are also formed by using selected input and output ports of multiplexer 902 and a FP-SOA of Amplifier array 920. These wavelengths $\lambda 1$–$\lambda 3$ are then coupled using a coupler (from group 930) to a modulator (from group 940) to form modulated wavelengths $\lambda 1$ and $\lambda 3$, 950. In a manner similar to that previously described for FIG. 8, to generate a particular wavelength the input and output ports of multiplexer 902 are selected using the routing formula $N\lambda =(Nin+Nout-1)$ modulus N. This routing formula is used for identifying the ports to be connected as part of the ring cavity for laser oscillation at wavelength number $N\lambda$, and is also used for selecting the input port of multiplexer 902 to enable the multiplexing of the added wavelength(s) to the output port of multiplexer 902. Illustratively in FIG. 9, to form the wavelength $\lambda 3$ the input port is shown as 7 and the output port is 5. Inserting input port 7 and output port 5 into the above-referenced routing formula $N\lambda =(Nin+Nout-1)$ produces $N\lambda =(7+5-1)=11$. Since the modulus is 8 for demultiplexer 801 (i.e., it has 8 inputs and outputs) the number 11 is counter down by the modulus 8 and results in a remainder of 3, indicating that the wavelength $\lambda 3$ will be formed in the ring laser. In a similar manner, the wavelengths $\lambda 1, \lambda 2$ and $\lambda 4$ are formed using input and output ports of demultiplexer 801 selected using the same routing formula $N\lambda =(Nin+Nout-1)$ modulus N.

It should be noted that the number of wavelengths produced by the add/drop circuit 900 is determined by the size (i.e., the number of input and output ports) of the AWGR used as multiplexer 902. Additionally, it should be noted that since the AWGR used as multiplexer 902 is bidirectional, the FP-SOA array 920 and coupler group 930 can be flipped left-to-right so that the generated wavelengths $\lambda 1$–$\lambda 4$ flow in a counter-clockwise direction in their respective loops (rather than clockwise as shown in FIG. 9).

In conclusion, we have demonstrated single-mode oscillation of an arrayed-waveguide grating Erbium-fiber ring laser. The laser output wavelength is selectable between 24 wavelengths of a silica-based WGR 111 wavelength multiplexer. The spectral narrowing effect of the FP-SOA 105 used in the ring cavity to achieve single mode output is analyzed in a model that can be used for the design of the ring laser. Error-free performance of the laser under 5 Gb/s modulation was demonstrated. The ring laser can be combined with add/drop circuits to provide practical and effective circuit arrangements.

While the present invention has been described as using a AWGR it should be recognized that other types of wavelength multiplexer/demultiplexer elements may be used, one such example is a dense wavelength division multiplexer manufactured by either E-TEK Dynamics or JDS Fitel. Thus, what has been described is merely illustrative of the application of the principles of the present invention. Other arrangements and methods can be implemented by those skilled in the art without departing from the spirit and scope of the present invention.

APPENDIX

REFERENCES

[1] M. G. Young, U. Koren, B. I. Miller, M. Chien, T. L. Koch, D. M. Tennant, K. Feder, K. Dreyer, and G. Raybon, "Six wavelength laser array with integrated amplifier and modulator," Electron. Lett., vol.31, pp. 1835–836, 1995.

[2] M. Zimgibl, C. H. Joyner, L. W. Stulz, U. Koren, M.-D. Chien, M. G. Young, and B. I. Miller, "Digitally tunable laser based on the integration of waveguide grating multiplexer and an optical amplifier," IEEE Photon. Technol. Lett., vol.6, pp. 516–518, 1994.

[3] C. R. Doerr, C. H. Joyner, L. W. Stulz, and J. C. Centanni, "Wavelength selectable laser with inherent wavelength and single-mode stability," IEEE Photon. Technol. Lett., vol.9, pp. 1430–1432, 1997.

[4] H. Takahashi, H. Toba, and Y. Inoue, "Multiple wavelength ring laser composed of EDFAs and an arrayed-waveguide wavelength multiplexer," Electron. Lett., vol.30, pp. 44–45, 1994.

[5] T. Miyazaki, N. Edagawa, S. Yamamodo, and S. Akiba, "A multiwavelength fiber ring-laser employing a pair of silica-based arrayed-waveguide-gratings," IEEE Photon. Technol. Lett., vol.9, pp. 910–912, 1997.

[6] Y. T. Chieng, G.J. Cowle, and R. A. Minasian, "optically amplitude-stabilized tunable Er-doped fiber laser with <20 ms tuning speed," Electron. Lett., vol.31, pp. 1451–1452, 1995.

[7] A. E. Siegman, "Lasers", University Science Books, ISBN 0-935702-11-3, 1986.

What is claimed is:

1. A wavelength-selectable ring laser comprising
a wavelength selection unit arranged for receiving an optical signal from an output of a Fabry-Perot optical amplifier and for outputting a selected one of a plurality of wavelength bands of the optical signal to said Fabry-Perot optical amplifier thereby forming a ring laser with said Fabry-Perot optical amplifier,
said Fabry-Perot optical amplifier receiving the selected wavelength band, amplifying a predefined sub-band of the selected wavelength band, and outputting said amplified predefined sub-band to said wavelength selection unit such that said ring laser oscillates in a single axial mode, and
a coupler connected in said ring laser so as to output said single axial mode optical signal from the ring laser.

2. The ring laser of claim 1 wherein said wavelength selection unit includes a wavelength multiplexer/demultiplexer element connected to pass the selected wavelength band.

3. The ring laser of claim 1 wherein said wavelength multiplexer/demultiplexer element is an arrayed waveguide grating router.

4. The ring laser of claim 1 wherein said wavelength selection unit includes a wavelength multiplexer/demultiplexer element connected to a 1×N electrically switchable optical switch for selecting the selected wavelength band.

5. The ring laser of claim 1 wherein said wavelength selection unit includes a wavelength multiplexer/demultiplexer element connected to a 1×N mechanically switchable optical switch for selecting the selected wavelength band.

6. The ring laser of claim 2 wherein said wavelength multiplexer/demultiplexer element is connected as a multiplexer.

7. The ring laser of claim 2 wherein said wavelength multiplexer/demultiplexer element is connected as a demultiplexer.

8. The ring laser of claim 1 wherein the output of wavelength selection unit connects through said coupler to said Fabry-Perot optical amplifier.

9. The ring laser of claim 1 wherein the output of said Fabry-Perot optical amplifier connects through said coupler element to said wavelength selection unit.

10. The ring laser of claim 1 further including a modulator for modulating said single axial mode optical signal outputted from said coupler.

11. The ring laser of claim 1 being part of an add circuit of a wavelength division multiplexing (WDM) optical communication system to add a wavelength to the system.

12. The ring laser of claim 1 further comprising
an isolator connected between the output of said Fabry-Perot optical amplifier and the input of said router.

13. The ring laser of claim 1 further comprising
an polarization controller connected in the ring laser to minimize polarization dependence of the ring laser.

14. The ring laser of claim 1 further comprising
an Erbium doped fiber amplifier connected in the ring laser to amplify any optical signal propagating in the ring laser.

15. The ring laser of claim 1 further comprising
an semiconductor optical amplifier connected in the ring laser to amplify any optical signal propagating in the ring laser.

16. A wavelength-selectable ring laser comprising
a wavelength demultiplexer element connected to receive an optical signal and to demultiplex it into a plurality of wavelength bands,
a plurality of switchable optical amplifiers, each of said amplifiers being individually switched-on to select and amplify one of the plurality of wavelength bands of the wavelength demultiplexer element,
a wavelength multiplexer element connected to receive a selected amplified wavelength band from a switched-on amplifier and to output said selected wavelength band, and
a coupler, connected between the wavelength multiplexer element and the wavelength demultiplexer element, for outputting said selected wavelength band from the ring laser.

17. The ring laser of claim 16 wherein at least one of the switchable optical amplifiers is an Erbium doped fiber amplifier.

18. The ring laser of claim 16 wherein at least one of the switchable optical amplifiers is a Fabrey-Perot semiconductor optical amplifier.

19. The ring laser of claim 16 wherein the wavelength demultiplexer and the wavelength multiplexer elements are each an arrayed wavelength grating router (AWGR).

20. The ring laser of claim 16 being part of an add/drop circuit of a wavelength division multiplexing (WDM) optical communication system and used to provide an add wavelength to an add section of the add/drop circuit.

21. The ring laser of claim 16 further comprising an isolator connected in the ring laser to insure that optical signal travel in only one direction in the ring laser.

22. The ring laser of claim 16 further comprising an polarization controller connected in the ring laser to minimize polarization dependence of the ring laser.

23. An optical wavelength add/drop circuit comprising a wavelength demultiplexer element for dropping at least one wavelength of a received wavelength division multiplexed, WDM, optical signal and for passing one or more wavelengths of the WDM signal, a wavelength multiplexer element for adding at least one wavelength to be multiplexed together with the one or more passed wavelengths received from the wavelength demultiplexer element, a ring laser for generating a predetermined one of the at least one added wavelength, said ring laser including a selected unused input and a selected unused output port of the wavelength demultiplexer element, the selected output port connected through an optical amplifier to the selected input port, an optical coupler connected in said ring laser so as to output said predetermined wavelength from the ring laser, and an optical modulator for modulating the predetermined wavelength and coupling it as an added wavelength to the wavelength multiplexer element.

24. The optical wavelength add/drop circuit of claim 23 including a plurality of said ring lasers and wherein one or more of the modulated predetermined wavelengths are coupled as added wavelengths to the wavelength multiplexer element.

25. The optical wavelength add/drop circuit of claim 23 wherein the wavelength multiplexer and the wavelength demultiplexer elements are each an arrayed waveguide grating router.

26. The optical wavelength add/drop circuit of claim 23 wherein the selected unused input and selected unused output port of the wavelength demultiplexer element are selected using a routing formula $N\lambda=(Nin+Nout-1)$ modulus N, where $N\lambda$ is a predetermined wavelength to be produced by the ring laser and $N\lambda=\lambda N$ when $N\lambda=0$, where Nin is the input port and Nout is the output port of the wavelength demultiplexer element which is needed to produce the desired wavelength $N\lambda$, and where modulus N is the number of input and output ports of the wavelength demultiplexer element.

27. An optical wavelength add/drop circuit comprising a wavelength demultiplexer element for dropping at least one wavelength of a received wavelength division multiplexed, WDM, optical signal and for passing one or more wavelengths of the WDM signal, a wavelength multiplexer element for adding at least one wavelength to be multiplexed together with the one or more passed wavelengths received from the wavelength demultiplexer element, a ring laser for generating a predetermined one of the at least one added wavelength, said ring laser including a selected unused input and a selected unused output port of the wavelength multiplexer element, the selected output port connected through an optical amplifier to the selected input port, an optical coupler connected in said ring laser so as to output said predetermined wavelength from the ring laser, and an optical modulator for modulating the predetermined wavelength and coupling it as an added wavelength to the wavelength multiplexer element.

28. The optical wavelength add/drop circuit of claim 27 including a plurality of said ring lasers and wherein one or more of the modulated predetermined wavelengths are coupled as added wavelengths to the wavelength multiplexer element.

29. The optical wavelength add/drop circuit of claim 27 wherein the wavelength multiplexer and the wavelength demultiplexer elements are each an arrayed waveguide grating router.

30. The optical wavelength add/drop circuit of claim 29 wherein the selected unused input and selected unused output port of the wavelength multiplexer element are selected using a routing formula $N\lambda=(Nin+Nout-1)$ modulus N, where $N\lambda$ is a predetermined wavelength to be produced by the ring laser and $N\lambda=\lambda N$ when $N\lambda=0$, where Nin is the input port and Nout is the output port of the wavelength multiplexer element which is needed to produce the desired wavelength $N\lambda$, and where modulus N is the number of input and output ports of the wavelength multiplexer element.

31. A method of operating a wavelength-selectable ring laser comprising the steps of:

at a wavelength selection unit receiving an optical signal from an output of an optical amplifier and outputting a selected one of a plurality of wavelength bands of the optical signal to said optical amplifier thereby forming a ring laser with said optical amplifier, at said optical amplifier receiving the selected wavelength band, amplifying a predefined sub-band of the selected wavelength band, and outputting said amplified predefined sub-band to said wavelength selection unit such that said ring laser oscillates in a single axial mode, and at a coupler connected in said ring laser outputting said single axial mode optical signal from the ring laser.

* * * * *